United States Patent
Moon

(10) Patent No.: US 6,929,987 B2
(45) Date of Patent: Aug. 16, 2005

(54) MICROELECTRONIC DEVICE FABRICATION METHOD

(75) Inventor: Jeong-Sun Moon, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 11 days.

(21) Appl. No.: 10/746,620

(22) Filed: Dec. 23, 2003

(65) Prior Publication Data

US 2005/0136577 A1 Jun. 23, 2005

(51) Int. Cl.$^7$ .............................. H01L 21/338
(52) U.S. Cl. .................. 438/167; 438/169; 438/172; 438/570; 438/571; 438/597; 438/598; 257/25; 257/27; 257/30; 257/54; 257/183; 257/183.1; 257/267; 257/280; 257/281
(58) Field of Search ................ 438/167–175, 438/570–573, 597–598, 620, 623; 257/25–27, 30, 54, 183–183.1, 194, 267, 280–281

(56) References Cited

U.S. PATENT DOCUMENTS

| | | | | |
|---|---|---|---|---|
| 4,888,626 A | * | 12/1989 | Davey | 257/283 |
| 4,903,092 A | * | 2/1990 | Luryi et al. | 257/183.1 |
| 5,135,880 A | * | 8/1992 | Fisher et al. | 438/237 |
| 5,223,449 A | | 6/1993 | Morris et al. | 437/51 |
| 5,270,225 A | | 12/1993 | Goronkin et al. | 437/31 |
| 5,324,682 A | * | 6/1994 | Tserng | 438/172 |
| 5,405,793 A | * | 4/1995 | Ikalainen et al. | 438/167 |
| 5,406,094 A | * | 4/1995 | Arimoto et al. | 257/24 |
| 5,422,505 A | * | 6/1995 | Shirai | 257/327 |
| 5,453,631 A | * | 9/1995 | Onda et al. | 257/192 |
| 5,650,642 A | * | 7/1997 | Sawada et al. | 257/192 |
| 6,008,509 A | * | 12/1999 | Inai et al. | 257/192 |
| 6,057,566 A | * | 5/2000 | Eisenbeiser et al. | 257/194 |
| 6,080,995 A | | 6/2000 | Nomoto | 257/20 |
| 6,110,393 A | | 8/2000 | Simmons et al. | 216/36 |
| 6,458,640 B1 | * | 10/2002 | Li | 438/167 |
| 6,724,025 B1 | * | 4/2004 | Takashima et al. | 257/288 |
| 6,835,969 B1 | * | 12/2004 | Marsh et al. | 257/197 |
| 6,844,227 B2 | * | 1/2005 | Kubo et al. | 438/216 |

OTHER PUBLICATIONS

C. Ladner et al. "Comparative investigation of gate leakage current in single and double channel InP HEMT" InP and related Materials, 1998 International conference May 1998 pp. 505–508.*

T. Enoki et al. "InGaAs/InP double channel HEMT on InP" InP related Materials, 1992, fourth International conference, Apr. 21–24, 1992, pp. 14–17.*

* cited by examiner

Primary Examiner—B. William Baumeister
Assistant Examiner—Granvill D. Lee, Jr.
(74) Attorney, Agent, or Firm—Ladas & Parry LLP

(57) ABSTRACT

In a method of forming a semiconductor device with a first channel layer formed over a portion of a second channel layer, a portion of the second channel underlying the first channel is etched so as to form an overhanging ledge in the first channel, and then a metallic contact disposed on top of the ledge portion is diffused into the first channel by ohmic alloying to form an electrode in the first channel.

18 Claims, 5 Drawing Sheets

MICROELECTRONIC DEVICE FABRICATION METHOD

TECHNICAL FIELD

This disclosure relates to methods for manufacturing microelectronic devices such as semiconductor electronic integrated circuits, and more particularly to an improved method for forming independent metal contacts in such devices using known ohmic alloying processes.

BACKGROUND

Semiconductor devices and quantum transport devices have revolutionized the electronics industry and made possible the fabrication of digital logic circuits with ever-decreasing device count, power usage, and circuit complexity. Such devices are typically formed from a number of discrete material layers of various metals, insulators, and semiconductors, and are often doped with specific impurities to adjust their electronic properties as desired. These layers are usually very thin, with thicknesses on the order of 500–3000 Å. As these devices become smaller, and the layers thinner, their response time decreases as well. For instance, devices based on resonant tunneling effects can exhibit intrinsic response times in the sub-picosecond range. Tunneling is an inherently fast physical process and to date, resonant tunneling diodes (RTDs) are the fastest solid-state devices reported.

To overcome problems associated with diode-based digital circuits, RTD circuits have been integrated with high electron mobility transistors (HEMTS) or heterojunction bipolar transistors (HBTs), which have resulted in increasingly complex material growth processes. Other efforts have been dedicated to developing unipolar and bipolar resonant tunneling transistors (RTTs). Recent RTTs employ closed coupled quantum wells in Si or GaAs. U.S. Pat. No. 6,080,995 to Nomoto, for instance, discloses such a quantum device functioning as a memory device, wherein application of a voltage to a gate electrode allows electrons to tunnel from a first to a second quantum well and accumulate therein, thereby indicating a change in state of the device.

The fabrication of such devices is not a trivial matter, and complexity increases while manufacturing yield decreases as the devices become smaller. U.S. Pat. No. 6,110,393 to Simmons et al, for instance, discloses an epoxybond-and-stop-etch (EBASE) method for fabricating a double electron layer tunneling (DELTT) device wherein circuit components are grown atop a stop etch layer on a first substrate, and then bonded to a host substrate with a bonding agent. Subsequently the first substrate is etched away while the components are protected by the stop etch layer. This process requires additional backside processing steps to selectively contact each quantum well by boring vias to the emitter and collector contacts. Each of the flip-chip, substrate removal, and backside via forming steps must be carried out within very tight tolerances, and even slight errors can significantly impact fabrication yields. Thus, the suitability of this-process to manufacturing RTT ICs appears to be less that ideal.

What is needed is an improved method for fabricating semiconductor ICs such as RTTs that enable electrically-tunable resonant tunneling between closely coupled channels without a complex backside process, and particularly a method for forming independent contacts to the closely coupled channels. The embodiments of the present disclosure answer these and other needs.

SUMMARY

In a first embodiment disclosed herein, a method of forming independent metallic contacts to each channel in a semiconductor device having at least a first channel layer formed over a portion of a second channel layer comprises applying a photoresist layer over the first channel layer, exposing the device to a preselected etching solution to remove a predetermined portion of the second channel layer underlying the first channel layer such that a portion of the first channel layer overhangs the second channel layer, the etching solution selected to have no substantial effect on the photoresist layer, removing the photoresist layer, applying a first metallic contact to the portion of the first channel layer overhanging the second channel layer, applying a second metallic contact to the second channel layer, and exposing the device to an ohmic alloying process to diffuse the metallic contacts into the first and second channel layers, respectively.

In another embodiment disclosed herein, a method of forming independent metallic contacts to each channel in a semiconductor device having at least a first channel layer formed over a portion of a second channel layer comprises applying a first metallic contact to a first portion of the first channel layer, applying a second metallic contact to the second channel layer, applying a photoresist layer over the first channel layer and over the second metallic contact so as to leave exposed at least a portion of the second channel adjacent to the first channel, exposing the device to a preselected etching solution to remove a predetermined portion of the second channel layer underlying the first channel layer such that a portion of the first channel layer overhangs the second channel layer, the etching solution selected to have no substantial effect on the photoresist layer, removing the photoresist layer, and exposing the device to an ohmic alloying process to diffuse the metallic contacts into the first and second channel layers, respectively.

In a further embodiment disclosed herein, the device is exposed to the preselected etching solution for a predetermined length of time to remove the predetermined portion of the second channel layer underlying the first channel layer. In a still further embodiment, the device further comprises a barrier layer disposed between the channel layers. After exposing the device to the ohmic alloying process, a third metallic contact may be applied to the second channel layer to provide a gate electrode to enable the device to function as a resonant tunneling transistor.

These and other features and advantages will become further apparent from the detailed description and accompanying figures that follow. In the figures and description, numerals indicate the various features, like numerals referring to like features throughout both the drawings and the description.

DETAILED DESCRIPTION

Figure 1A:
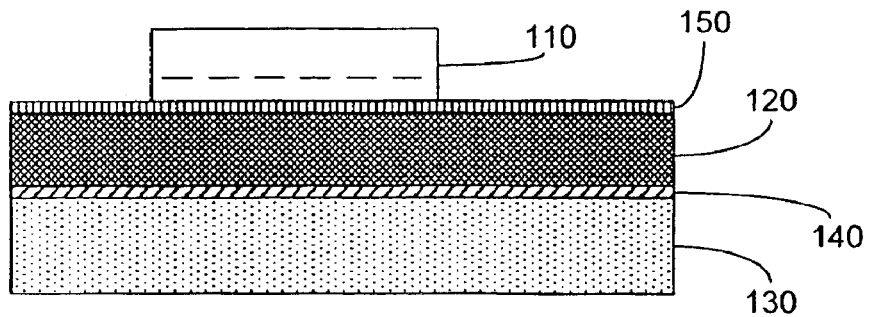
FIGS. 1A–G are diagrams illustrating various stages in one embodiment as described herein.
Figure 3:
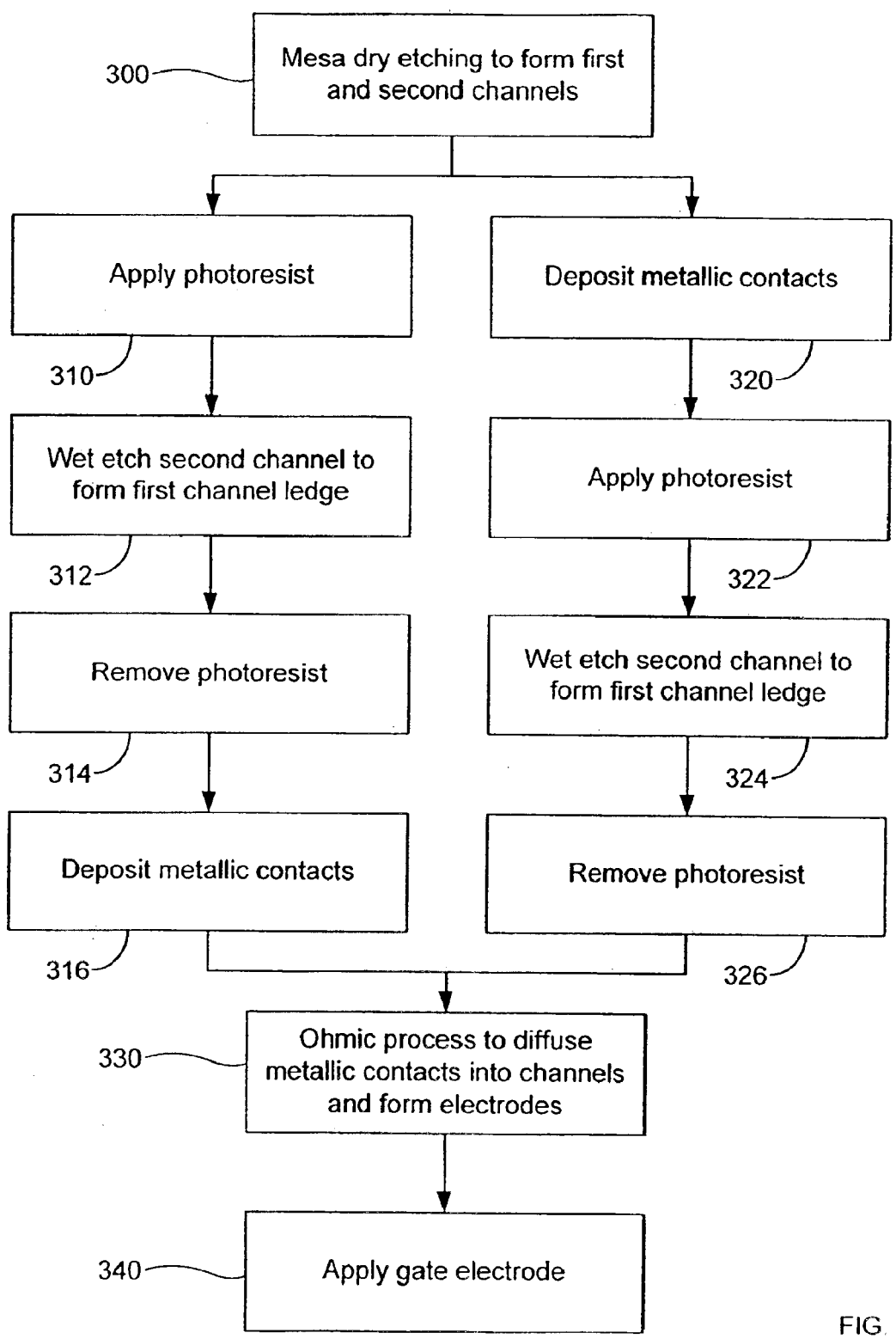
FIG. 3 is a flowchart with the stages illustrated in FIGS. 1 and 2.

Referring to FIGS. 1A and 3, in one embodiment described herein, a RTT device fabrication process ensues with a mesa being formed 300 upon a second channel layer 120 to overlie a portion thereof and define a first channel layer 110 thereupon. Second channel layer 120 is formed over a substrate 130 with a first barrier layer 140 therebetween. A second barrier layer 150 is disposed between the first channel layer 110 and the second channel layer 120 and covers substantially all of the second channel. Various insulating materials may be used to form the substrate 130, as known in the art, including InP. The channel layers 110 and 120 may be formed from various semiconductors as known in the art, such as doped or undoped InGaAs. The barrier layers 140 and 150 may be formed of various suitable materials as known to those skilled in the art, such as doped or undoped InP and InAlAs. The mesa defining the first channel may be formed by conventional photolithography techniques or any other practicable means.

Figure 1B:
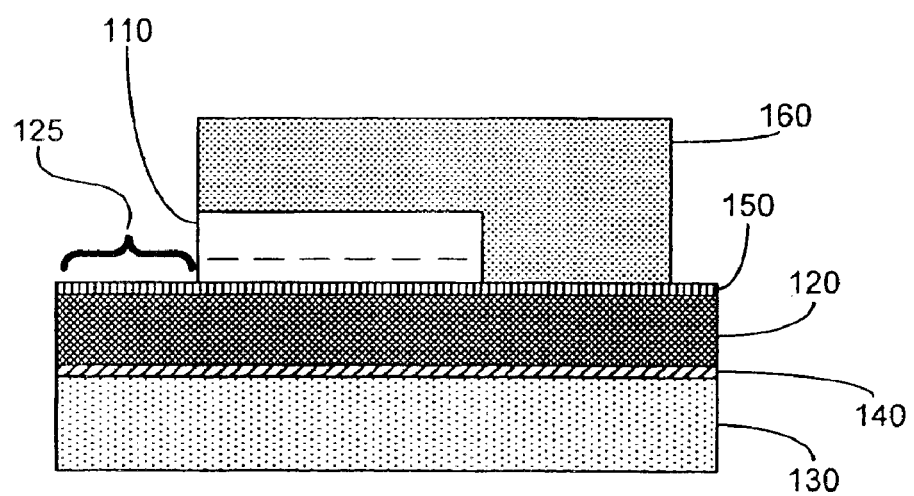

Referring to FIG. 1B, a photoresist layer 160 is next applied 310 over the first channel 110 and part of the portion of the second channel 120 (covered by barrier 150) that is not overlain by the first channel. It must be noted that another part of the portion of the second channel (and the barrier 150 disposed thereover) that is not overlain by the first channel is left uncovered by the photoresist layer, as exemplified by segment 125 in the figure.

Figure 1C:
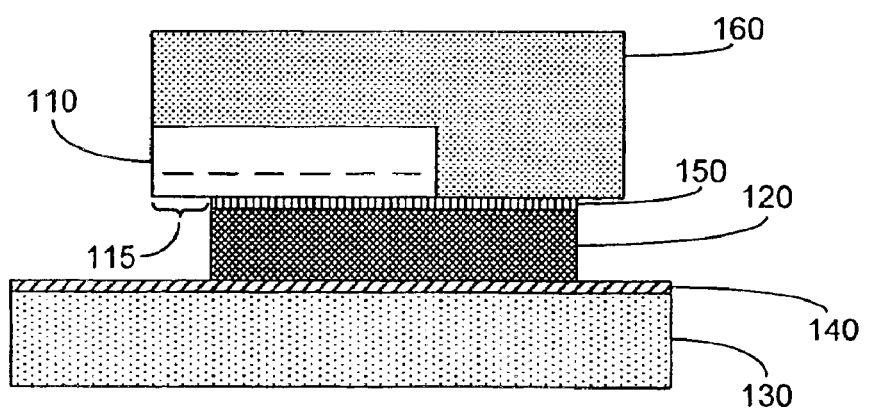

After the photoresist layer 160 has been applied, the entire device is exposed 312 to a wet etching solution such as a citric-based wet etching solution. The etching. solution is selected so that it removes the second channel 120 material as well as the second barrier 150 material, but does not substantially remove the photoresist layer 160 material. The device is exposed to the etching solution for a predetermined amount of time, sufficient to remove a desired amount of the second channel layer 120 and second barrier 150 materials lying underneath the first channel 110 so that, as illustrated in FIG. 1C, an overhanging ledge 115 is formed in the first channel that has no other layer immediately below, and contacting, it.

Figure 1D:
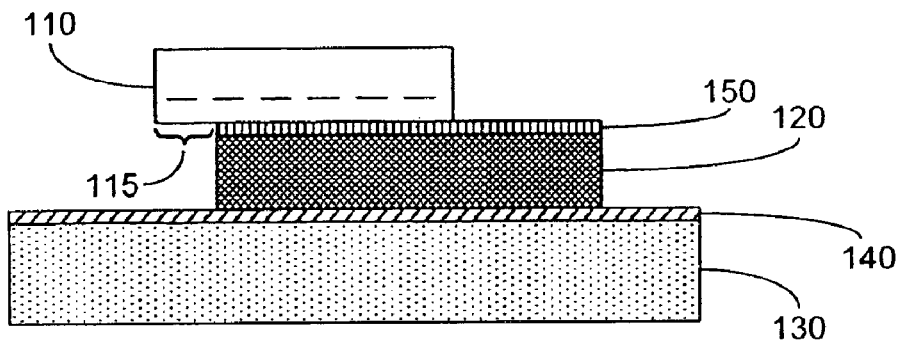
Figure 1E:
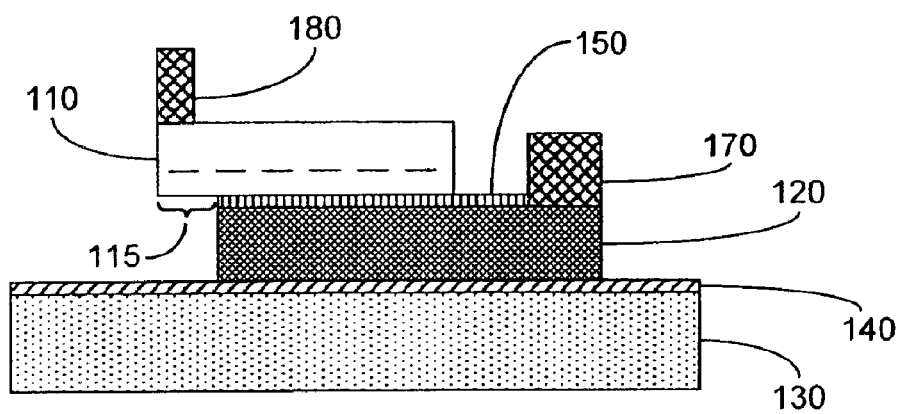

As illustrated in FIG. 1D, in the ensuing step the photoresist layer 160 is removed 314, thereby exposing the first channel 110 and the newly formed ledge 115 overhanging the second channel 120 and second barrier 150. With reference to FIG. 1E, a portion of the second barrier is next removed, such as by etching, to expose part of the second channel 120 laying underneath, and a second metallic contact 170 is then deposited 316 upon the thus-exposed portion of the second channel. Similarly, a first metallic contact 180 is deposited 316 upon the upper surface of the first channel ledge 115 in a configuration such that no part of the first metallic contact overlies the second barrier 150 and second channel 120. The metallic contacts may be formed, inter alia, of n+ or Si doped InGaAs.

The device is next exposed to an ohmic alloying process 330 to cause the second metallic contact 170 to diffuse into the second channel 120 that lies underneath it and form the drain electrode of the device. Similarly, the ohmic process causes the first metallic contact 180 to diffuse into the first-channel 110 that lies underneath it and form the source electrode of the device. The first metallic contact 180 is initially disposed over the overhanging ledge 115 portion of the first channel 110, and thus cannot diffuse into the second barrier 150 or into the second channel 120 because neither the second barrier nor the second channel are in contact with the ledge portion of the first channel. Thus, by use of the method disclosed herein, the ohmic process variables (such as length of time and temperature) can be controlled to a lesser degree of precision than previously required because the physical configuration of the device layers prevents the inadvertent shorting of the first and second channel by accidentally diffusing the second contact through the first channel and into the second channel. This is a commonly encountered problem in semiconductor IC fabrication and heretofore. difficult to overcome.

Figure 1F:
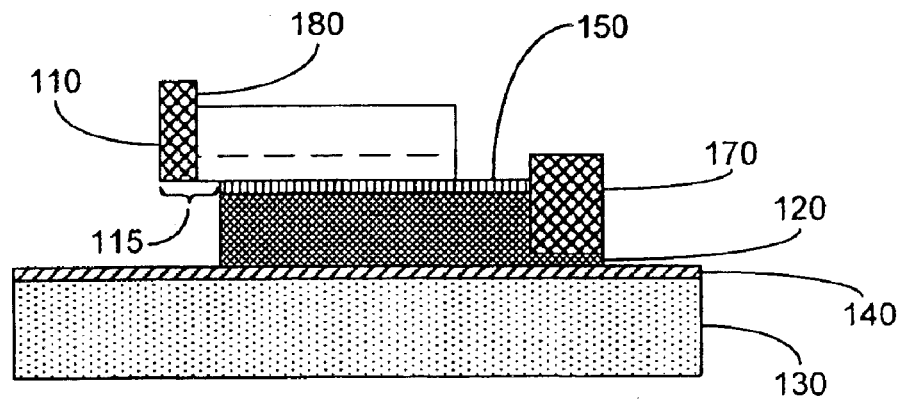
Figure 1G:
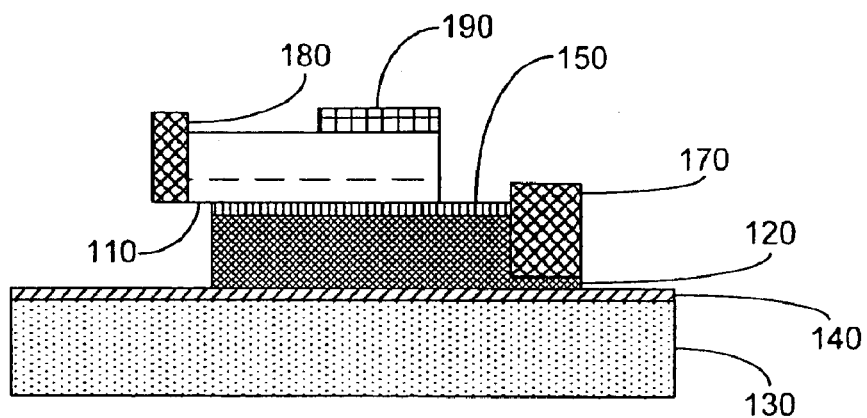

In a final step, as is well known in the art and illustrated by FIG. 1G, a third metallic contact 190 is deposited 340 upon the first channel 110 to form the gate of the device and thus enabling the device to function as a RTT. In one embodiment, contact 190 may be a Schottky gate and may be formed, inter alia, of Si-delta doped InP.

Figure 2A:
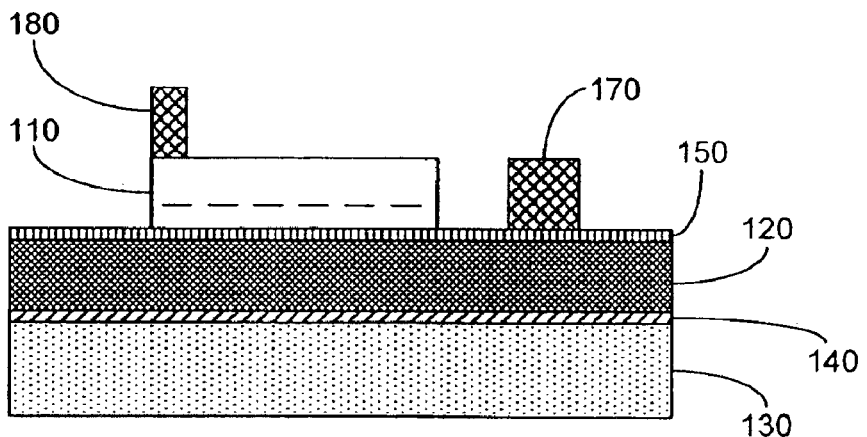
FIGS. 2A–D are diagrams illustrating various stages in another embodiment as described herein.

An important element of the embodiments disclosed herein is that the second channel is etched from beneath a portion of the first channel prior to the ohmic alloying process is activated to diffuse the metallic material of the electrodes into the channels, to thereby prevent the inadvertent diffusion of metallic material through both channels. Thus, other embodiments of the method discussed above may be practiced. For instance, as illustrated by FIGS. 2A and 3, the second metallic contact 170 and the first metallic contact 180 may be deposited 320 upon the second channel 120 and first channel 110, respectively, prior to exposing the device to the etchant solution.

Figure 2B:
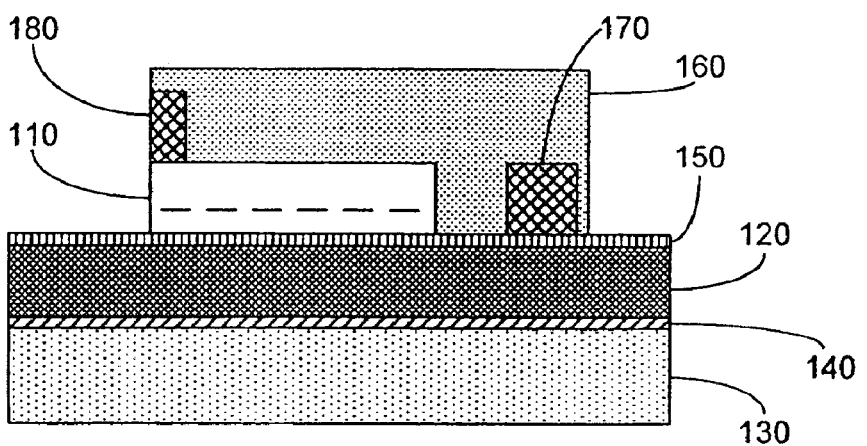
Figure 2C:
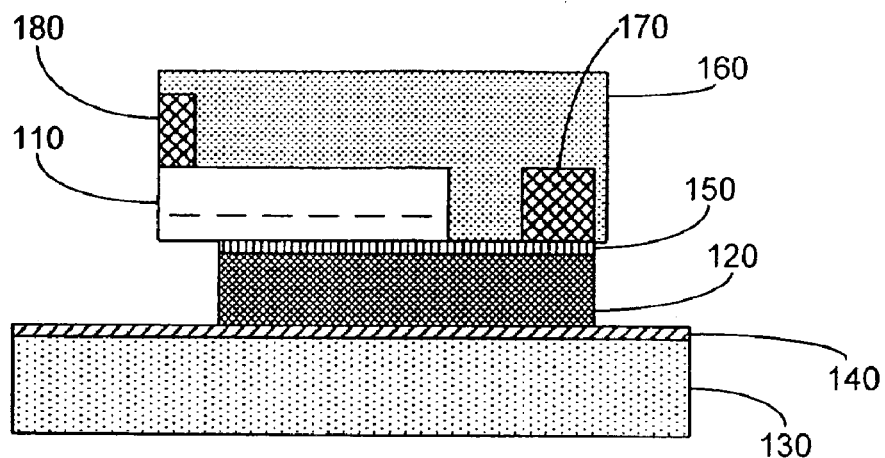
Figure 2D:
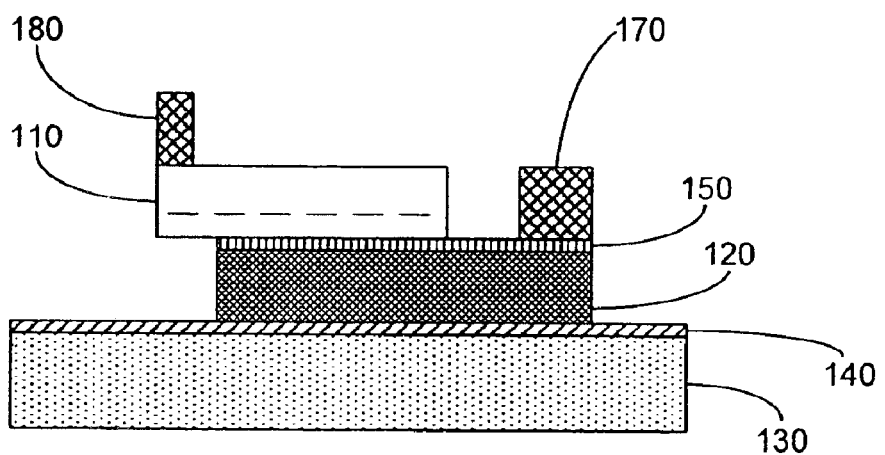

Referring to FIG. 2B, the photoresist layer 160 is then applied 322 over the first channel 110 and part of the portion of the second channel 120 (covered by barrier 150) that is not overlain by the first channel, as previously described. As illustrated by FIG. 2C, the device is next exposed to the wet etching solution 324 to remove the desired amount of the second channel layer 120 and second barrier 150 materials lying underneath the first channel 110 so as to form overhanging ledge 115 in the first channel. As in the previous embodiment, the photoresist layer is then removed 326 to expose the first channel ledge 115 and the metallic contacts 170 and 180, as shown in FIG. 2D. As previously described in connection with FIGS. 1F and 1G, the device is then exposed to an ohmic process 330 to diffuse the metallic contacts into the respective channels and form electrodes therein, and the third metallic contact is deposited 340 upon the first channel to form the gate of the RTT device.

By enabling easy and accurate fabrication of independent electrical contacts to the channels, the embodiments disclosed herein enable fabrication of a RTT device that exhibits negative-differential-resistance (NDR) in the current-voltage curve when biased, and that further enables electric-field tuning of the carrier density in the first channel, thereby providing gate voltage tunable NDR. The embodiments disclosed herein for fabricating independent contacts can be applied to any semiconductor technology, including-Si, III–V, and II–VI.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

What is claimed is:

1. A method of forming independent metallic contacts to each channel in a semiconductor device having at least a first channel layer formed over a portion of a second channel layer, the method comprising:

applying a photoresist layer over the at least one first channel layer;

exposing the device to a preselected etching solution to remove a predetermined portion of the second channel layer underlying the at least one first channel layer such that a portion of the at least one first channel layer overhangs the second channel layer, the etching solution selected to have no substantial effect on the photoresist layer;

removing the photoresist layer;

applying a first metallic contact to the portion of the at least one first channel layer overhanging the second channel layer;

applying a second metallic contact to the second channel layer; and exposing the device to an ohmic alloying process to diffuse the metallic contacts into the first and second channel layers, respectively.

2. The method of claim 1, wherein exposing the device to the preselected etching solution comprises:

exposing the device to the preselected etching solution for a predetermined length of time to remove the predetermined portion of the second channel layer underlying the at least one first channel layer.

3. The method of claim 1, wherein the channel layers comprise InGaAs.

4. The method of claim 1, wherein the device further comprises a barrier layer disposed between the channel layers.

5. The method of claim 4, wherein the barrier layer comprises InP.

6. The method of claim 1, wherein the metallic contacts comprise n+ doped InGaAs.

7. The method of claim 1, wherein the metallic contacts comprise Si doped InGaAs.

8. The method of claim 1, further comprising, after exposing the device to the ohmic alloying process:

applying a third metallic contact to the second channel layer to provide a gate electrode to enable the device to function as a resonant tunneling transistor.

9. The method of claim 8, wherein the third metallic contact is a Schottky gate.

10. A method of forming independent metallic contacts to each channel in a semiconductor device having at least a first channel layer formed over a portion of a second channel layer, the method comprising:

applying a first metallic contact to a first portion of the at least one first channel layer;

applying a second metallic contact to the second channel layer;

applying a photoresist layer over the at least one first channel layer and over the second metallic contact so as to leave exposed at least a portion of the second channel adjacent to the at least one first channel;

exposing the device to a preselected etching solution to remove a predetermined portion of the second channel layer underlying the at least one first channel layer such that a portion of the at least one first channel layer overhangs the second channel layer, the etching solution selected to have no substantial effect on the photoresist layer;

removing the photoresist layer; and exposing the device to an ohmic alloying process to diffuse the metallic contacts into the first and second channel layers, respectively.

11. The method of claim 10, wherein exposing the device to the preselected etching solution-comprises:

exposing the device to the preselected etching solution for a predetermined length of time to remove the predetermined portion of the second channel layer underlying the at least one first channel layer.

12. The method of claim 10, wherein the channel layers comprise InGaAs.

13. The method of claim 10, wherein the device further comprises a barrier layer disposed between the channel layers.

14. The method of claim 13, wherein the barrier layer comprises InP.

15. The method of claim 10, wherein the metallic contacts comprise n+ doped InGaAs.

16. The method of claim 10, wherein the metallic contacts comprise Si doped InGaAs.

17. The method of claim 10, further comprising after exposing the device to the ohmic alloying process:

applying a third metallic contact to the second channel layer to provide a gate electrode to enable the device to function as a resonant tunneling transistor.

18. The method of claim 17, wherein the third metallic contact is a Schottky gate.

* * * * *